US009842848B2

(12) United States Patent
Wu et al.

(10) Patent No.: US 9,842,848 B2
(45) Date of Patent: Dec. 12, 2017

(54) EMBEDDED HKMG NON-VOLATILE MEMORY

(71) Applicant: Taiwan Semiconductor Manufacturing Co., Ltd., Hsin-Chu (TW)

(72) Inventors: Wei Cheng Wu, Zhubei (TW); Li-Feng Teng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/967,813

(22) Filed: Dec. 14, 2015

(65) Prior Publication Data

US 2017/0170189 A1    Jun. 15, 2017

(51) Int. Cl.
*H01L 29/792* (2006.01)
*H01L 27/11568* (2017.01)
(Continued)

(52) U.S. Cl.
CPC .. *H01L 27/11568* (2013.01); *H01L 21/28282* (2013.01); *H01L 21/32115* (2013.01); *H01L 21/32139* (2013.01); *H01L 27/11573* (2013.01); *H01L 29/42344* (2013.01); *H01L 29/42376* (2013.01); *H01L 29/4916* (2013.01);
(Continued)

(58) Field of Classification Search
CPC ......... H01L 27/11568; H01L 27/11573; H01L 21/28282; H01L 21/32115; H01L 21/32139; H01L 29/42344; H01L 29/42376; H01L 29/4916; H01L 29/513; H01L 29/518; H01L 29/66545; H01L 29/6656
See application file for complete search history.

(56) References Cited

U.S. PATENT DOCUMENTS 9,583,641 B1 *    2/2017   Chang ................. H01L 29/7923
2007/0102731 A1 *  5/2007   Sakagami ............ H01L 27/105
                                                    257/207

(Continued)

OTHER PUBLICATIONS

U.S. Appl. No. 14/967,767, filed Dec. 14, 2015.
Non- Final Office Action dated May 19, 2017 in connection with U.S. Appl. No. 14/967,767.

*Primary Examiner* — Mark Tornow
(74) *Attorney, Agent, or Firm* — Eschweiler & Potashnik, LLC

(57) ABSTRACT

The present disclosure relates to an integrated circuit (IC) that includes a high-k metal gate (HKMG) non-volatile memory (NVM) device and that provides small scale and high performance, and a method of formation. In some embodiments, the integrated circuit includes a logic region having a logic device disposed over a substrate and including a first metal gate disposed over a first high-k gate dielectric layer and an embedded memory region disposed adjacent to the logic region. The embedded memory region has a split gate flash memory cell including a select gate and a control gate. The control gate or the select gate is a metal gate separated from the substrate by a second high-k gate dielectric layer. By having HKMG structures in both the logic region and the memory region, IC performance is improved and further scaling becomes possible in emerging technology nodes.

20 Claims, 9 Drawing Sheets

(51) Int. Cl.
    *H01L 27/11573*    (2017.01)
    *H01L 29/423*      (2006.01)
    *H01L 29/49*       (2006.01)
    *H01L 29/51*       (2006.01)
    *H01L 29/66*       (2006.01)
    *H01L 21/28*       (2006.01)
    *H01L 21/3213*     (2006.01)
    *H01L 21/321*      (2006.01)

(52) U.S. Cl.
    CPC .......... *H01L 29/513* (2013.01); *H01L 29/518* (2013.01); *H01L 29/6656* (2013.01); *H01L 29/66545* (2013.01)

(56) References Cited

U.S. PATENT DOCUMENTS

| | | | |
|---|---|---|---|
| 2012/0248523 A1* | 10/2012 | Shroff | B82Y 10/00 |
| | | | 257/316 |
| 2015/0041875 A1* | 2/2015 | Perera | H01L 29/78 |
| | | | 257/314 |
| 2015/0060989 A1* | 3/2015 | Loiko | H01L 29/49 |
| | | | 257/324 |

\* cited by examiner

EMBEDDED HKMG NON-VOLATILE MEMORY

BACKGROUND

Embedded memory is a technology that is used in the semiconductor industry to improve performance of an integrated circuit (IC). Embedded memory is a non-stand-alone memory, which is integrated on the same chip with a logic core and which supports the logic core to accomplish an intended function. High-performance embedded memory is a component in VLSI because of its high-speed and wide bus-width capability, which limits or eliminates inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
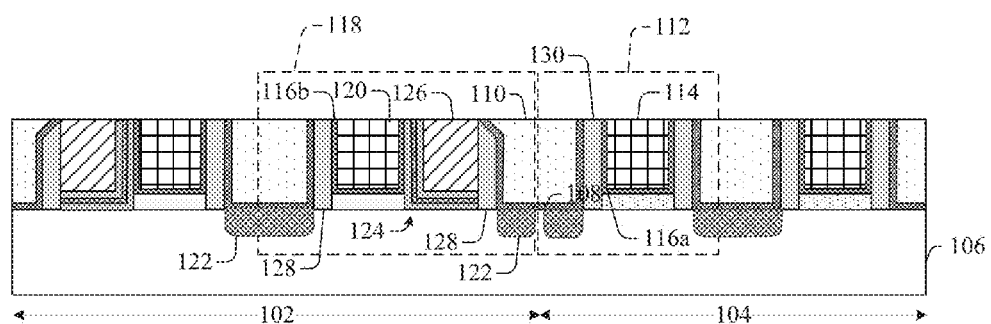
FIG. 1 illustrates a cross-sectional view of some embodiments of an integrated circuit (IC) comprising a high-k metal gate (HKMG) non-volatile memory (NVM) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the semiconductor industry has begun to integrate logic devices and memory devices on a single semiconductor chip. This integration improves performance over solutions where two separate chips—one for memory and another for logic—cause undesirable delays due to wires or leads that connect the two chips. In addition, the processing costs for integrating memory and logic devices on the same semiconductor chip are reduced due to the sharing of specific process steps used to fabricate both types of devices. One common type of embedded memory is embedded flash memory. Embedded flash memory may include a select gate arranged between first and second source/drain regions of a flash memory cell. The flash memory cell may also include a control gate arranged alongside the select gate and separated from the select gate by a charge trapping dielectric layer.

High-k metal gate (HKMG) technology has also become one of the front-runners for the next generation of CMOS devices. HKMG technology incorporates a high-k dielectric, which has a dielectric constant greater than previous gate oxides, to increase transistor capacitance and reduce gate leakage. A metal gate is used instead of a polysilicon gate to help with fermi-level pinning and to allow the gate to be adjusted to low threshold voltages. By combining the metal gate and the high-k dielectric, HKMG technology makes further scaling possible and allows integrated chips to function with reduced power.

The present disclosure relates to an integrated circuit (IC) that comprises a high-k metal gate (HKMG) non-volatile memory (NVM) device and that provides small scale and high performance, and a method of formation. In some embodiments, the integrated circuit comprises a logic region and an adjacent embedded memory region disposed over a substrate. The logic region comprises a logic device including a first metal gate disposed over a first high-k gate dielectric layer. The memory region comprises a flash memory cell including a select gate and a control gate separated by a charge trapping layer extending under the control gate. The select gate or the control gate can be a metal gate. In some embodiments, bottom and sidewall surfaces of the metal gate are lined by a high-k gate dielectric layer. By having HKMG structures in both the logic region and the memory region, IC performance is improved and further scaling becomes possible in emerging technology nodes (e.g., 28 nm and below).

FIG. 1 illustrates a cross-sectional view of some embodiments of an IC 100 comprising a HKMG NVM device, or a hybrid NVM device. The IC 100 comprises a logic region 104 and an embedded memory region 102 disposed adjacent to the logic region 104. The logic region 104 comprises a logic device 112 disposed over a substrate 106. The logic device 112 comprises a first metal gate 114 disposed over a first high-k gate dielectric layer 116a. The embedded memory region 102 comprises a non-volatile memory (NVM) device 118 including a second metal gate 120 disposed over a second high-k gate dielectric layer 116b. In some embodiments, the first and second metal gates 114, 120 respectively have bottom and sidewall surfaces lined by the first and second high-k gate dielectric layer 116a, 116b. The first and second metal gates 114, 120 may have cuboid shapes, which have upper surfaces aligned with one another. By having HKMG structure in both the logic device 112 and the NVM device 118, transistor capacitance (and thereby drive current) is increased and gate leakage and threshold voltage are reduced.

In some embodiments, the NVM device 118 comprises a split gate flash memory cell disposed over the substrate 106. The split flash memory cell comprises a control gate 126 separated from a select gate by a charge trapping layer 124. In some embodiments, the second metal gate 120 may comprise the select gate of the split flash memory cell. In some embodiments, the control gate 126 comprises polysilicon. The charge trapping layer 124 extends under the control gate 126 and separates the control gate 126 from the substrate 106. Source/drain regions 122 are arranged at opposite sides of the select gate and the control gate 126.

The select gate may be connected to a word line, which is configured to control access of the split flash memory cell. The second high-k gate dielectric layer 116b reduces tunneling gate leakage, and allows a low voltage to be applied to the select gate to form an inversion channel below the select gate. During operation, charges (e.g. electrons) can be injected to the charge trapping layer 124 through the source/drain regions 122 to program the flash memory cell. The low select gate voltage helps to minimize drain current and leads to a relatively small programming power. A high voltage is applied to the control gate 126 which attracts or repels electrons to or from the charge trapping layer 124, yielding a high injection or removal efficiency.

The logic region 104 and the embedded memory region 102 are laterally separated from one another by an inter-layer dielectric layer 110. In some embodiments, a contact etch stop layer 108 separates the inter-layer dielectric layer 110 from the logic device 112, the NVM device 118 and the substrate 106. The contact etch stop layer 108 may line the logic device 112 and the NVM device 118 and have a substantially planar upper surface that extends between the logic region 104 and the embedded memory region 102. Using the inter-layer dielectric layer 110 and the contact etch stop layer 108 to isolate the logic device 112 and the NVM device 118 allows for high device density to be achieved.

In some embodiments, the IC 100 further comprises a first sidewall spacer 128 disposed along the opposite sides of the select gate and the control gate 126. A second sidewall spacer 130 is disposed along the first metal gate 114. In some embodiments, the first and second sidewall spacers 128, 130 can be made of silicon nitride. The contact etch stop layer 108 may have a 'U' shaped structure between the logic region 104 and the memory region 102. The 'U' shaped structure has a first vertical component abutting the first sidewall spacer 128 and a second vertical component abutting the second sidewall spacer 130. The first and second sidewall spacers 128, 130 contact an upper surface of the substrate 106. In some embodiments, the first sidewall spacer 128 has a portion with a sidewall aligned with sidewalls of the charge trapping layer 124 and the control gate 126 disposed thereon.

Figure 2:
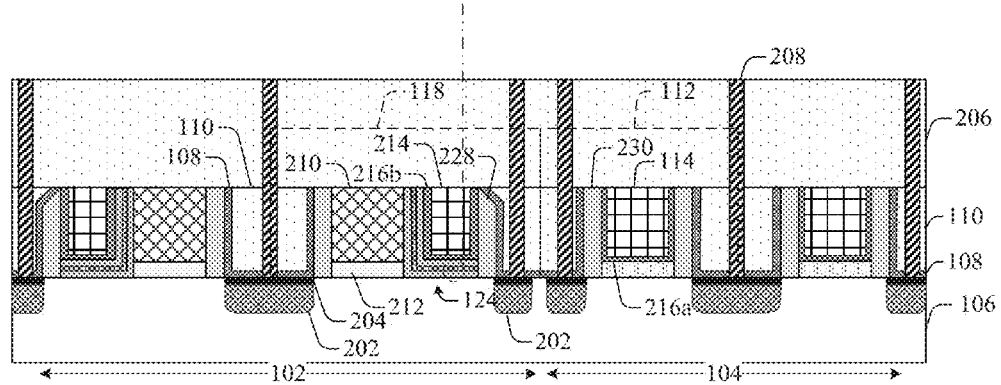
FIG. 2 illustrates a cross-sectional view of some additional embodiments of an IC comprising a HKMG NVM device.

FIG. 2 illustrates a cross-sectional view of some additional embodiments of an IC 200 comprising a HKMG NVM device, or a hybrid NVM device. The IC 200 comprises a logic region 104 having a logic device 112 and an embedded memory region 102 having a NVM device 118. A plurality of source/drain regions 202 are disposed within a substrate 106 in the logic region 104 and the embedded memory region 102. A silicide layer 204 is arranged onto the source/drain regions 202. In some embodiments, the silicide layer 204 comprises a nickel silicide. A first metal gate 114 is disposed over the substrate 106 within the logic region 104 at a location between source/drain regions 202. The first metal gate 114 has a bottom surface and sidewall surfaces lined by a first high-k gate dielectric layer 216a.

Within the memory region 102, a select gate 210 and a control gate 214 are disposed over the substrate 106. A charge trapping layer 124 is disposed between the select gate 210 and the control gate 214 and extends under the control gate 214. In some embodiments, the charge trapping layer 124 may comprise a tri-layer structure. For example, in some embodiments, the tri-layer structure may comprise an ONO structure having a first dielectric layer 124a (e.g. a silicon dioxide layer), a nitride layer 124b (e.g. a silicon nitride layer) contacting the first dielectric layer 124a, and a second dielectric layer 124c (e.g. a silicon dioxide layer) contacting the nitride layer 124b. In other embodiments, the tri-layer structure may comprise an oxide-nano-crystal-oxide (ONCO) structure having a first oxide layer, a layer of crystal nano-dots (e.g. silicon dots) contacting the first oxide layer, and a second oxide layer contacting the first oxide layer and the layer of crystal nano-dots.

In some embodiments, the control gate 214 comprises metal and has a bottom surface and sidewall surfaces lined by a second high-k gate dielectric layer 216b. The select gate 210 comprises polysilicon and is separated from an underlying channel region between the source/drain regions 202 by a gate oxide layer 212. In some embodiments, the first metal gate 114 and the control gate 214 may comprise titanium (Ti), tantalum (Ta), tungsten (W), aluminum (Al) or ziconium (Zr), for example. In some embodiments, the first high-k gate dielectric layer 216a and the second high-k gate dielectric layer 216b may comprise hafnium oxide (HfO), hafnium silicon oxide (HfSiO), hafnium aluminum oxide (HfAlO), or hafnium tantalum oxide (HfTaO), for example.

In some embodiments, a first sidewall spacer 228 is disposed along sidewalls of the NVM device 118 and a second sidewall spacer 230 is disposed along sidewalls of the logic device 112. A contact etch stop layer 108 lines sidewalls of the first and second sidewall spacers 228, 230 and continuously extends along an upper surface of the substrate 106 and the silicide layer 204. In some embodiments, the contact etch stop layer 108 has a 'U' shaped structure between the logic region 104 and the memory region 102. The 'U' shaped structure has a first vertical component abutting the first sidewall spacer 228, a second vertical component abutting the second sidewall spacer 230, and a lateral component connecting the first vertical component and the second vertical component with a substantially planar upper surface. A first inter-layer dielectric layer 110 is disposed within a recess of the contact etch stop layer 108. In some embodiments, the first inter-layer dielectric layer 110 has an upper surface aligned with upper surfaces of the select gate 210, the control gate 214, the charge trapping layer 124 and the first metal gate 114.

In some embodiments, a second inter-layer dielectric layer 206 can be disposed over the NVM device 118 and the logic device 112. In some embodiments, the first inter-layer dielectric layer 110 and the second inter-layer dielectric layer 206 may comprise a low-k dielectric layer, an ultra low-k dielectric layer, an extreme low-k dielectric layer, and/or a silicon dioxide layer. A plurality of contacts 208 comprising a conductive material extend vertically through the second inter-layer dielectric layer 206. In some embodiments, one or more of the plurality of contacts may also extend through the first inter-layer dielectric layer 110 and the contact etch stop layer 108 and be coupled to the source/drain regions 202. In some embodiments, the plurality of contacts 208 may comprise a metal such as tungsten, copper, and/or aluminum.

Figure 3:
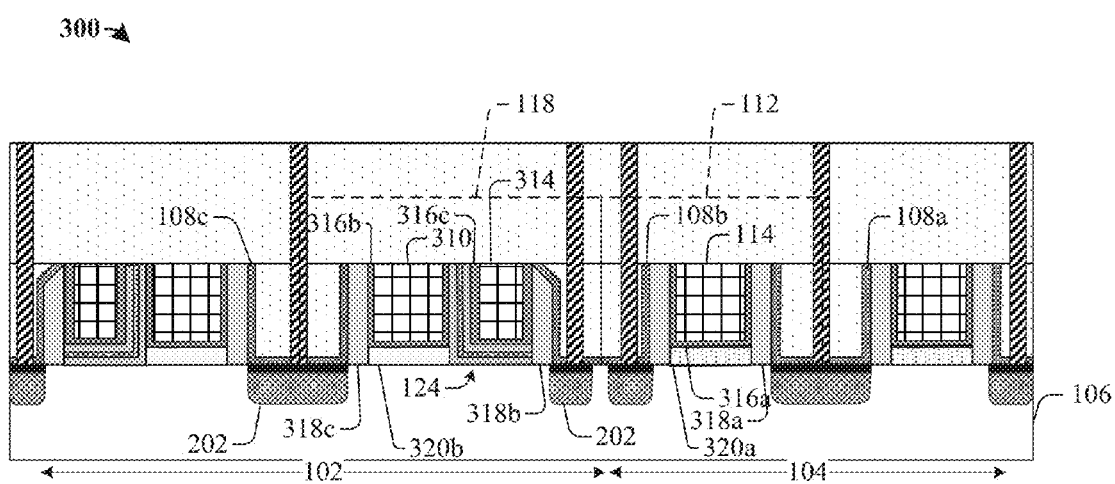
FIG. 3 illustrates a cross-sectional view of some additional embodiments of an IC comprising a HKMG NVM device.

FIG. 3 illustrates a cross-sectional view of some additional embodiments of an IC 300 comprising a HKMG NVM device. The IC 300 comprises a logic region 104 and an adjacent memory region 102 arranged over a substrate 106. The logic region 104 comprises a logic device 112 having a first metal gate 114 separated from the substrate 106 by a first high-k gate dielectric layer 316a. The memory region 102 comprises a NVM device 118. In some embodiments, the NVM device 118 comprises a plurality of split gate flash memory cells which respectively include a select gate 310 and a control gate 314 separated by a charge trapping layer 124. The charge trapping layer 124 extends under the control gate 314. In some embodiments, the select gate 310 and the control gate 314 are made of the same metal material of the first metal gate 114. The select gate 310 and the control gate 314 can have bottom and sidewall surfaces respectively lined by a second high-k gate dielectric layer 316b and a third high-k gate dielectric layer 316c. In some embodiments, the first metal gate 114 and the first high-k gate dielectric layer 316a are separated from the substrate 106 by a first portion 320a of a gate oxide, and the select gate 310 and the second high-k dielectric layer 316b are separated from the substrate 106 by a second portion 320b of the gate oxide. The first portion 320a and the second portion 320b of the gate oxide may have same or different thicknesses.

In some embodiments, a sidewall spacer 318a-318c has a first portion 318a disposed along a sidewall of the first metal gate 114, a second portion 318b disposed along a sidewall of the control gate 314, the third high-k gate dielectric layer 316c, and the charge trapping layer 124, and a third portion 318c disposed at a side of the select gate 310 opposing the control gate 314. A contact etch stop layer 108a-108c comprises a first U shaped portion 108a lining opposing sidewalls of the first portion 318a of the sidewall spacer within the logic region 104, a second U shaped portion 108b lining opposing sidewalls of the first portion 318a and the second portion 318b of the sidewall spacer between the logic region 104 and the memory region 102, and a third U shaped portion 108c lining opposing sidewalls of the third portion 318c of the sidewall spacer within the memory region 102.

Though not shown in above figures, logic devices of the logic region 104 and memory devices of the memory region 102 may comprise metal gates with different compositions. For example, the logic region 104 may comprise an NMOS transistor device having a high-k gate dielectric layer and an overlying NMOS metal gate and a PMOS transistor device having a high-k gate dielectric layer and an overlying PMOS metal gate. The NMOS metal gate has a different composition and a different work function than the PMOS metal gate. In some embodiments, the high-k gate dielectric layers may comprise hafnium oxide (HfO), hafnium silicon oxide (HfSiO), hafnium aluminum oxide (HfAlO), or hafnium tantalum oxide (HMO), for example. The metal gates may comprise titanium (Ti), tantalum (Ta), tungsten (W), aluminum (Al) or ziconium (Zr), for example.

FIGS. 4-12 illustrate a series of cross-sectional views 400-1200 of some embodiments of a method for manufacturing an IC comprising a HKMG NVM device.

Figure 4:
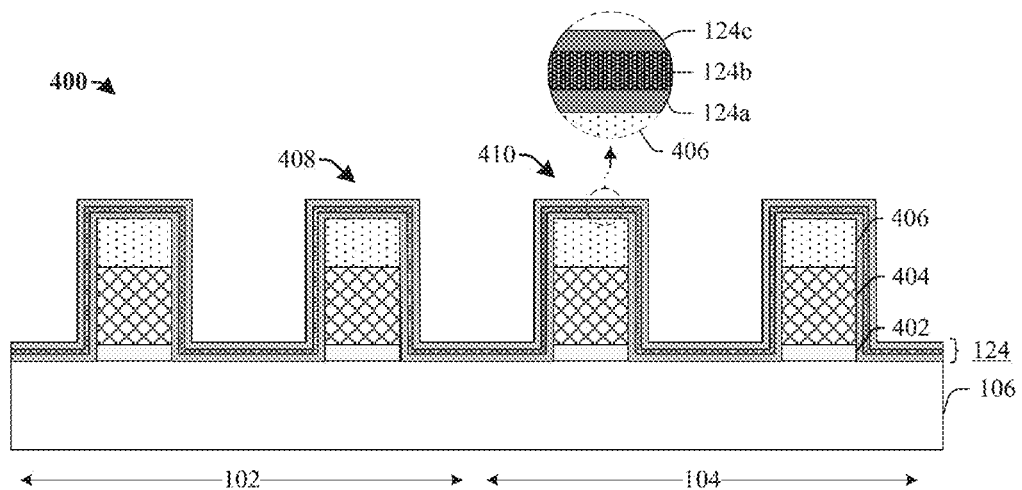
FIGS. 4-12D illustrate a series of cross-sectional views of some embodiments of a method for manufacturing an IC comprising a HKMG NVM device.

As shown in cross-sectional view 400 of FIG. 4, sacrificial gate stacks 408, 410 and a charge trapping layer 124 are formed over a substrate 106. A first sacrificial gate stack 410 is formed within a logic region 104 and a second sacrificial gate stack 408 is formed within a memory region 102. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. In some embodiments, the first sacrificial gate stack 410 and the second sacrificial gate stack 408 are formed by forming a sacrificial gate oxide layer 402 over the substrate 106, forming a conductive sacrificial gate layer, for example, a sacrificial polysilicon layer 404 over the sacrificial gate oxide layer 402, and forming a hard mask 406 over the sacrificial polysilicon layer 404. Then the sacrificial gate oxide layer 402, the sacrificial polysilicon layer 404 and the hard mask 406 are patterned and etched to form the first sacrificial gate stack 410 and the second sacrificial gate stack 408.

A charge trapping layer 124 is formed over the substrate 106, extending upwardly along sidewalls of the first and second sacrificial gate stacks 408, 410, and over the first and second sacrificial gate stacks 408, 410. In some embodiments, the charge trapping layer 124 is formed by using a deposition technique (e.g., PVD, CVD, PE-CVD, ALD, etc.) to form a tri-layer structure comprising an ONO structure having a first oxide layer 124a (e.g. a silicon dioxide layer), a nitride layer 124b (e.g. a silicon nitride layer) contacting the first oxide layer 124a, and a second oxide layer 124c contacting the nitride layer 124b.

Figure 5:
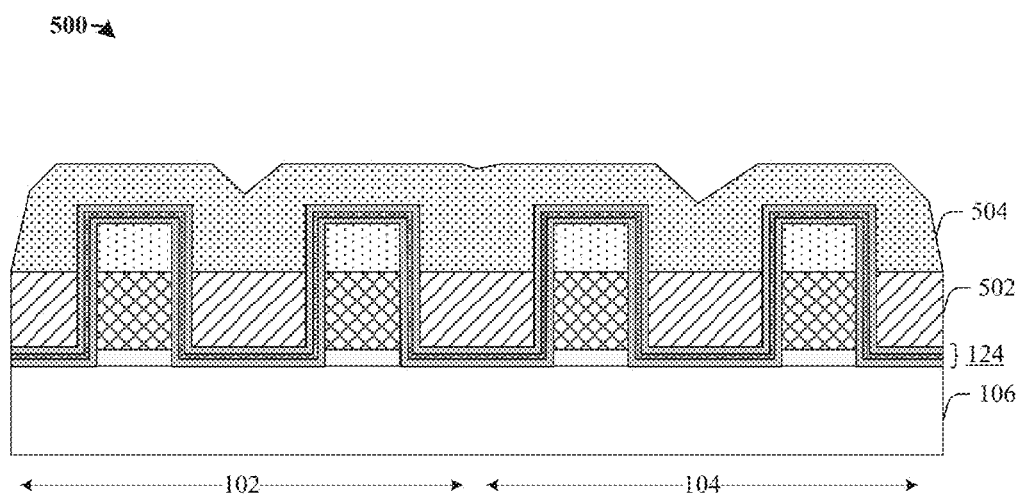

As shown in cross-sectional view 500 of FIG. 5, a conductive layer, for example, a control gate layer 502 and a sacrificial hard mask layer 504 are formed over the charge trapping layer 124. In some embodiments, the control gate layer 502 is formed and etched to get a planar upper surface where the sacrificial hard mask layer 504 is subsequently formed on. In some embodiments, the control gate layer 502 may comprise doped polysilicon or metal formed by a deposition process (e.g., CVD, PVD, ALD, etc.). In some embodiments, the sacrificial hard mask layer 504 may comprise an oxide or nitride formed by a deposition process.

Figure 6:
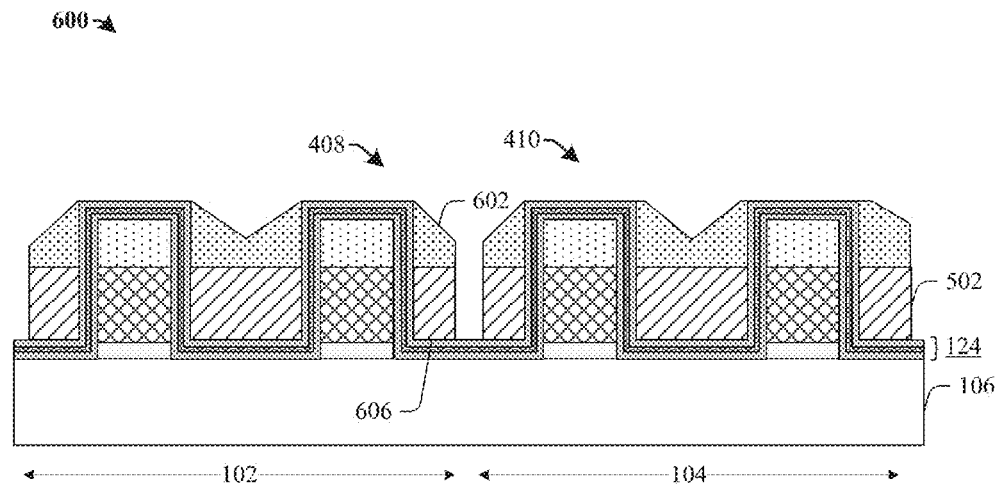

As shown in cross-sectional view 600 of FIG. 6, the control gate layer 502 and the sacrificial hard mask layer 504 are patterned to form a sacrificial control gate 606 and a hard mask 602 over the sacrificial control gate 606. In some embodiments, the sacrificial control gate 606 is formed by a self-aligned process. For example, an anisotropic etching is performed to remove lateral portions of the sacrificial hard mask layer 504 (e.g., 504 of FIG. 5) while leaving a vertical portion along sidewalls of the sacrificial gate stacks 408, 410 including the hard mask 602 arranged on the control gate layer 502. The control gate layer 502 (e.g., 502 of FIG. 5) is subsequently etched back with the hard mask 602 in place and functioned as a mask for the sacrificial control gate 606.

Figure 7:
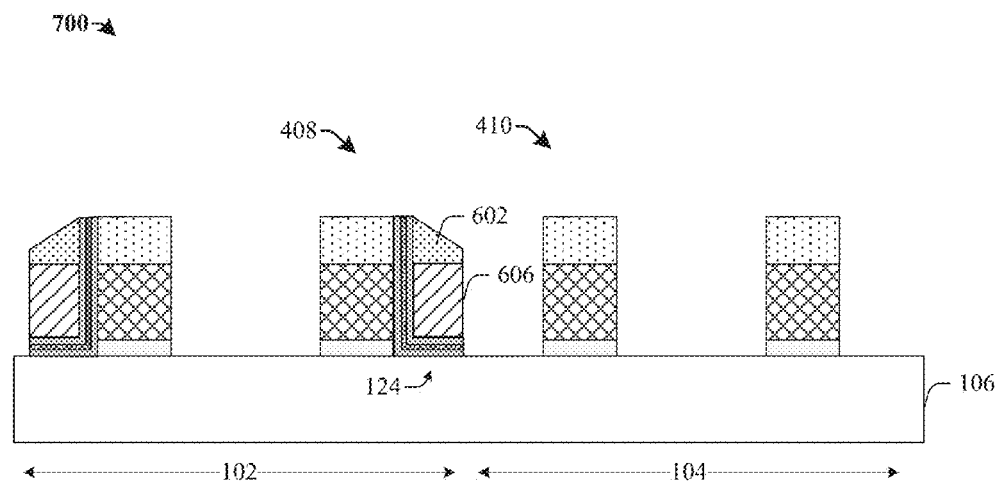

As shown in cross-sectional view 700 of FIG. 7, excessive materials of the sacrificial hard mask layer 504, the control gate layer 502, and the charge trapping layer 124 are removed by a series of etching processes. In some embodiments, within the memory region 102, the etching processes remove the sacrificial hard mask layer 504, the control gate layer 502, and the charge trapping layer 124 between opposing sides of the second sacrificial gate stacks 408 opposite to the sacrificial control gates 606. Within the logic region 104, the sacrificial hard mask layer 504, the control gate layer 502, and the charge trapping layer 124 are removed. In some embodiments, the excessive materials are removed by performing a photolithography process and forming a mask layer to protect the hard mask 602 and the sacrificial control gate 606 from removal. In various embodiments, the etching processes may comprise a dry etch (e.g., a plasma etch with tetrafluoromethane ($CF_4$), sulfur hexafluoride ($SF_6$), nitrogen trifluoride ($NF_3$), etc.).

Figure 8:
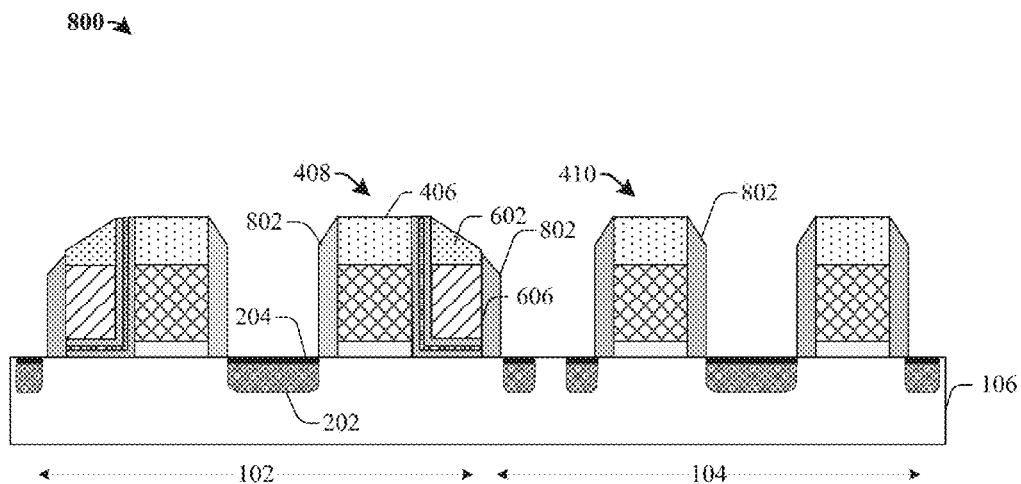

As shown in cross-sectional view 800 of FIG. 8, a sidewall spacer 802 is formed along the first sacrificial gate stack 410 and the second sacrificial gate stack 408. In some embodiments, the sidewall spacer 802 may comprise an oxide (e.g., $SiO_2$) or a nitride (e.g., SiN) formed by a deposition process. The sidewall spacer 802 may be formed on an upper surface of the substrate 106.

Source/drain regions 202 are subsequently formed within the memory region 102 and within the logic region 104, respectively. In some embodiments, the source/drain regions 202 may be formed by an implantation process that selectively implants the substrate 106 with a dopant, such as boron (B) or phosphorous (P), for example. In some other embodiments, the source/drain regions 202 may be formed by performing an etch process to form a trench followed by an epitaxial growth process. The source/drain regions 202 may have a raised portion that is higher than the upper surface of the substrate 106. In some embodiments, a salicidation process is performed to form a silicide layer 204 on upper surfaces of the source/drain regions 202. In some embodiments, the salicidation process may be performed by depositing a nickel layer and then performing a thermal annealing process (e.g., a rapid thermal anneal).

Figure 9:
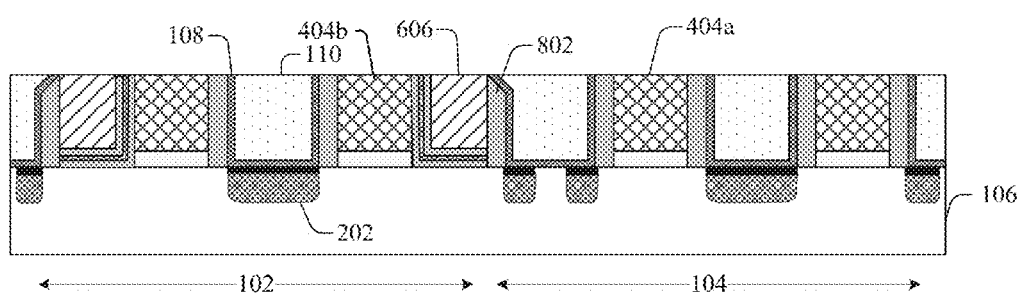

As shown in cross-sectional view 900 of FIG. 9, a conformal contact etch stop layer 108 is formed over the source/drain regions 202 and extends along the sidewall spacer 802. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. In some embodiments, the first inter-layer dielectric layer 110 may comprise a low-k dielectric layer, formed by way of a deposition process (e.g., CVD, PVD, etc.).

The first planarization process removes the hard mask 406, the hard mask 602 and an upper portion of the sidewall spacer 802, thereby exposing a first sacrificial gate 404a within the logic region 104, a sacrificial select gate 404b within the memory region and the sacrificial control gate 606. In some embodiments, the first planarization process may comprise a chemical mechanical polishing (CMP) process.

FIGS. 10A-10D show some embodiments of a subsequent replacement gate process following FIG. 9.

Figure 10A:
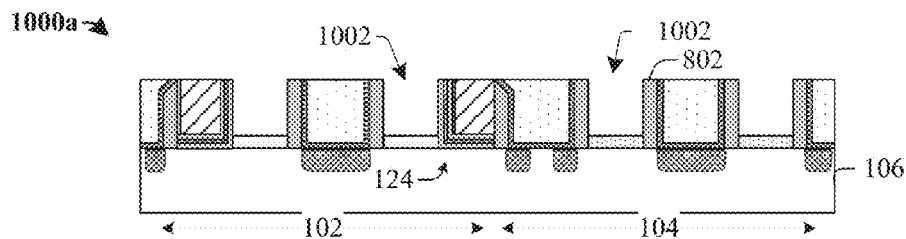

As shown in cross-sectional view 1000a of FIG. 10A, the first sacrificial gate 404a, the sacrificial select gate 404b, and the sacrificial gate oxide layer 402 (e.g. 402 in FIG. 9) are removed, resulting in the formation of trenches 1002 between the sidewall spacers 802 and/or between the sidewall spacers 802 and the charge trapping layer 124.

Figure 10B:
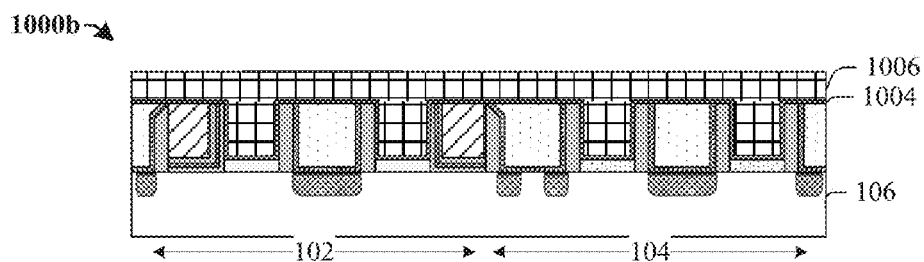

As shown in cross-sectional view 1000b of FIG. 10B, a conformal high-k gate dielectric layer 1004 is formed lining the trenches 1002. A metal layer 1006 is then formed on the high-k gate dielectric layer 1004 to fill the trenches 1002 using a deposition technique (e.g., chemical vapor deposition, physical vapor deposition, etc.). Though shown as depositing a single metal layer, it is appreciated that the replacement gate process may comprise a series of deposition and etching processes that form different metal compositions within trenches for different logic/memory devices, or different components of the same logic/memory devices. In this way, desired work functions can be achieved.

Figure 10C:
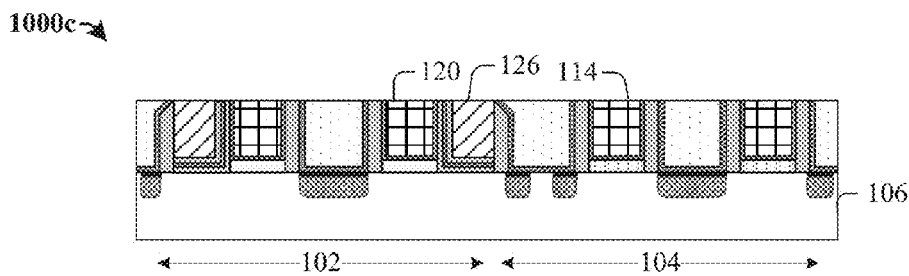

As shown in cross-sectional view 1000c of FIG. 10C, a second planarization process is performed. The second planarization process is performed on the metal layer 1006 and the high-k gate dielectric layer 1004 such that a first metal gate 114 is formed within the logic region 104 and a second metal gate 120 is formed within the memory region 102 adjacent to a control gate 126. The control gate 126 may comprise doped polysilicon or metal.

Figure 10D:
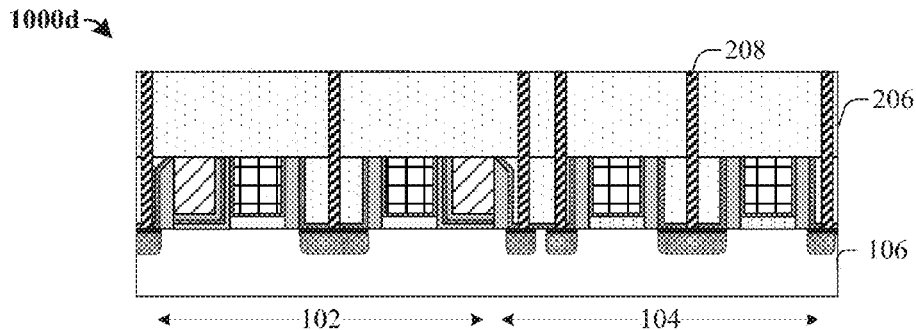

As shown in cross-sectional view 1000d of FIG. 10D, contacts 208 are formed within a second inter-layer dielectric layer 206 overlying the first inter-layer dielectric layer 110. The contacts 208 may be formed by selectively etching the second inter-layer dielectric layer 206 to form openings, and by subsequently depositing a conductive material within the openings. In some embodiments, the conductive material may comprise tungsten (W) or titanium nitride (TiN), for example.

FIGS. 11A-11D show some other embodiments of a subsequent replacement gate process following FIG. 9.

Figure 11A:
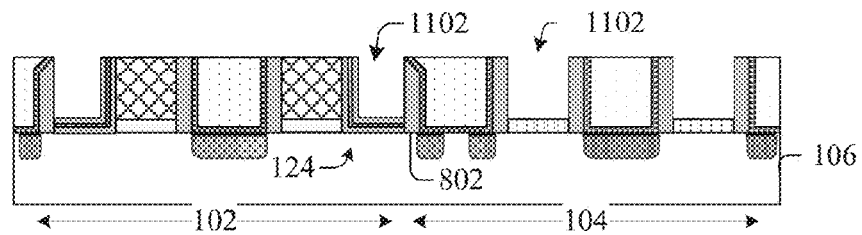

As shown in cross-sectional view 1100a of FIG. 11A, the first sacrificial gate 404a, the sacrificial control gate 606, and the sacrificial gate oxide layer 402 are removed to form trenches 1102, resulting in the formation of trenches 1102 between the sidewall spacers 802 and/or between the sidewall spacers 802 and the charge trapping layer 124.

Figure 11B:
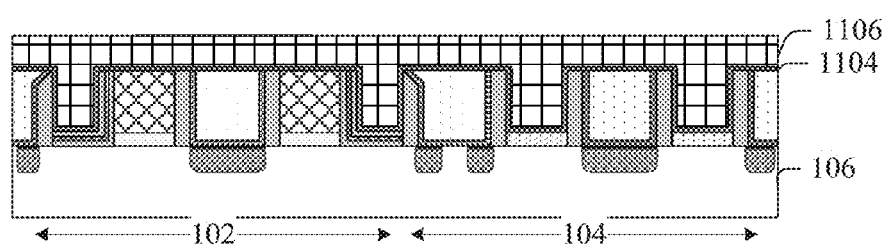

As shown in cross-sectional view 1100b of FIG. 11B, a conformal high-k gate dielectric layer 1104 is formed lining the trenches 1102. A metal layer 1106 is then formed on the high-k gate dielectric layer 1104 to fill the trenches 1102 using a deposition technique (e.g., chemical vapor deposition, physical vapor deposition, etc.).

Figure 11C:
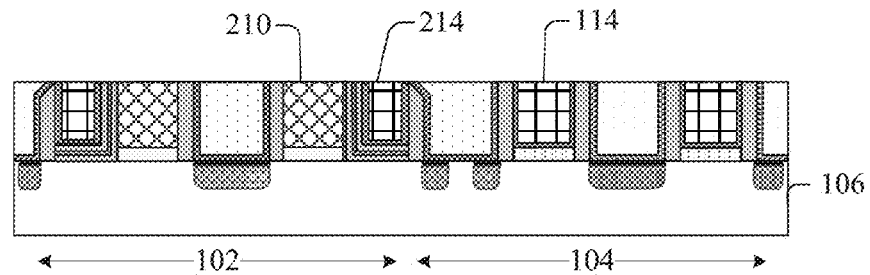

As shown in cross-sectional view 1100c of FIG. 11C, a second planarization process is performed. A first metal gate 114 is formed within the logic region 104 and a metal control gate 214 is formed within the memory region 102 adjacent to a select gate 210. In some embodiments, the select gate 210 is patterned before performing the replacement gate process. The select gate 210 may comprise doped polysilicon or metal.

Figure 11D:
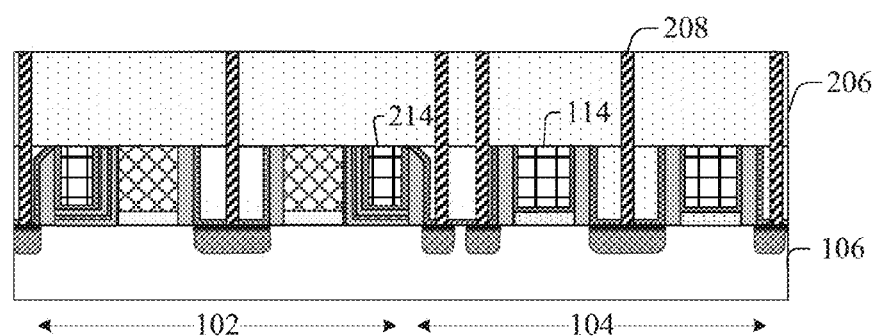

As shown in cross-sectional view 1100d of FIG. 11D, contacts 208 and a second inter-layer dielectric layer 206 are formed.

FIGS. 12A-12D show some other embodiments of a subsequent replacement gate process following FIG. 9.

Figure 12A:
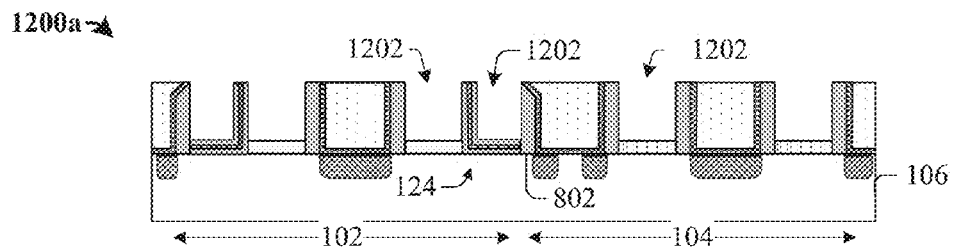

As shown in cross-sectional view 1200a of FIG. 12A, the first sacrificial gate 404a, the sacrificial control gate 606, the sacrificial select gate 404b, and the sacrificial gate oxide layer 402 are removed to form trenches 1202.

Figure 12B:
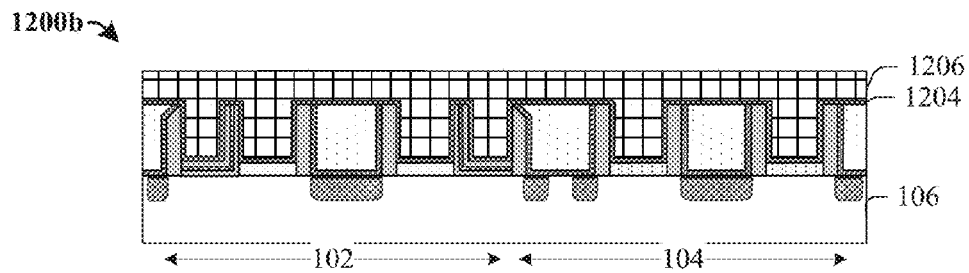

As shown in cross-sectional view 1200b of FIG. 12B, a conformal high-k gate dielectric layer 1204 is formed lining the trenches 1202. A metal layer 1206 is then formed on the high-k gate dielectric layer 1204 to fill the trenches 1202 using a deposition technique (e.g., chemical vapor deposition, physical vapor deposition, etc.).

Figure 12C:
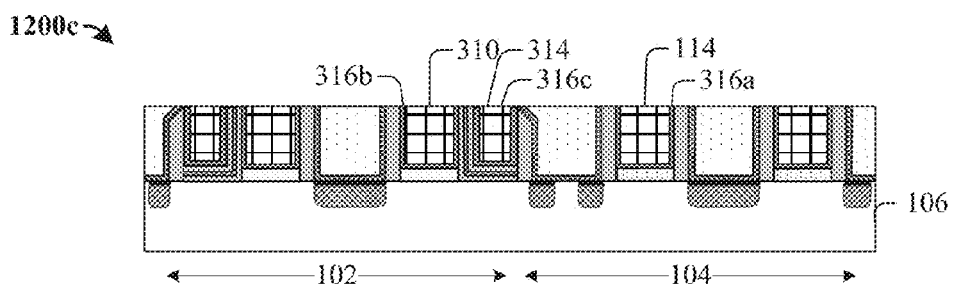

As shown in cross-sectional view 1200c of FIG. 12C, a second planarization process is performed. A first metal gate 114 is formed within the logic region 104. A metal select gate 310 and a metal control gate 314 are formed within the memory region 102. The first metal gate 114, the metal select gate 310 and the metal control gate 314 have bottom and sidewall surfaces respectively lined by the high-k gate dielectric layers 316a, 316b, and 316c.

Figure 12D:
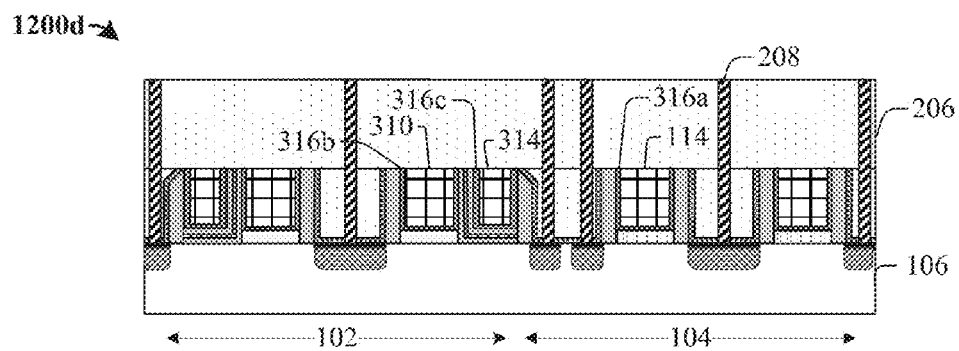

As shown in cross-sectional view 1200d of FIG. 12D, contacts 208 and a second inter-layer dielectric layer 206 are formed.

Figure 13:
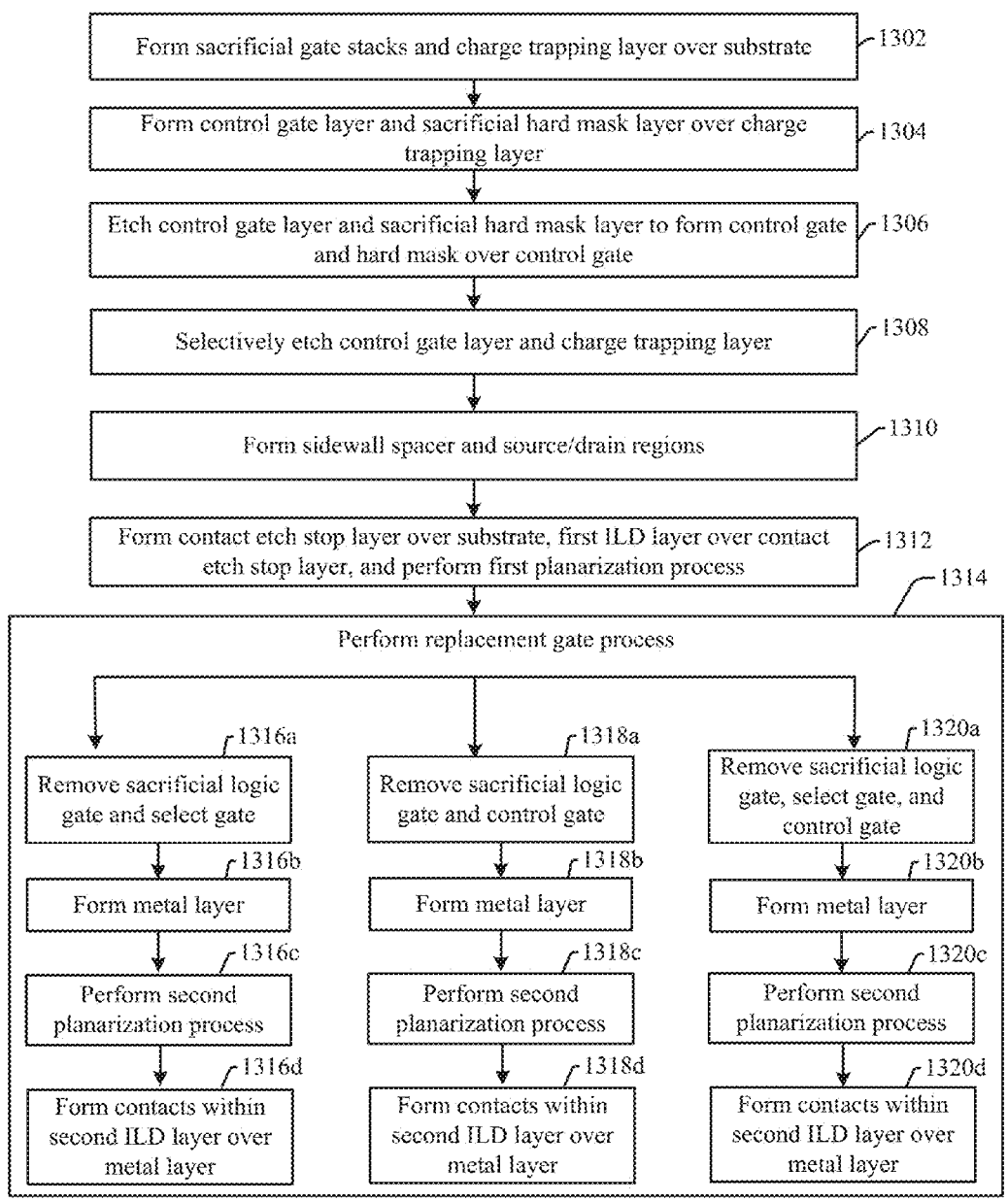
FIG. 13 illustrates a flow diagram of some embodiments of a method for manufacturing an IC comprising a HKMG NVM device.

FIG. 13 illustrates a flow diagram of some embodiments of a method 1300 for manufacturing an IC comprising a HKMG NVM device.

Although method 1300 is described in relation to FIGS. 4-12, it will be appreciated that the method 1300 is not limited to such structures, but instead may stand alone as a method independent of the structures. Furthermore, while the disclosed methods (e.g., method 1300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a first sacrificial gate stack within a logic region and a second sacrificial gate stack within a memory region are formed over a substrate. A charge trapping layer is formed along the sacrificial gate stacks. FIG. 4 illustrates some embodiments of a cross-sectional view 400 corresponding to act 1302.

At 1304, a control gate layer is formed over the charge trapping layer. In some embodiments, the control gate layer is etched back to form a planar upper surface and a sacrificial hard mask layer is formed over the control gate layer. FIG. 5 illustrates some embodiments of a cross-sectional view 500 corresponding to act 1304.

At 1306, the control gate layer and the sacrificial hard mask layer are etched to form a control gate and a hard mask over the control gate. In some embodiments, the control gate is formed using the hard mask as a self-aligned mask. FIG. 6 illustrates some embodiments of a cross-sectional view 600 corresponding to act 1306.

At 1308, the hard mask, the control gate and the charge trapping layer are selectively etched. Within the memory region, the etching processes remove the sacrificial hard mask layer, the control gate layer, and the charge trapping layer between opposing sides of the sacrificial gate stacks opposite to the control gates. Within the logic region, the sacrificial hard mask layer, the control gate layer, and the charge trapping layer are removed. FIG. 7 illustrates some embodiments of a cross-sectional view 700 corresponding to act 1308.

At 1310, a sidewall spacer and source/drain regions are formed. The sidewall spacers are formed along the first sacrificial gate stack and the second sacrificial gate stack. FIG. 8 illustrates some embodiments of a cross-sectional view 800 corresponding to act 1310.

At 1312, a contact etch stop layer is formed over the substrate, a first inter-level dielectric layer is formed over the contact etch stop layer, and a first planarization is performed. The sacrificial gates within the logic region and the memory region are exposed. FIG. 9 illustrates some embodiments of a cross-sectional view 900 corresponding to act 1312.

At 1314, a replacement gate process is subsequently performed. In various embodiments, the replacement gate process may be formed according to acts 1316a-1316d, acts 1318a-1318d, or acts 1320a-1320d.

At 1316a-1316d, a logic gate within the logic region and a select gate within the memory region are replaced by metal. Associated gate oxide layers are also removed and replaced by high-k gate dielectric layers. FIGS. 10A-10D illustrate some embodiments of cross-sectional views 1000a-1000d corresponding to act 1316a-1316d.

At 1318a-1318d, a logic gate within the logic region and a control gate within the memory region are replaced by metal. FIGS. 11A-11D illustrate some embodiments of cross-sectional views 1100a-1100d corresponding to act 1318a-1318d.

At 1320a-1320d, a logic gate within the logic region and a select gate and a control gate within the memory region are replaced by metal. FIGS. 12A-12D illustrate some embodiments of cross-sectional views 1200a-1200d corresponding to act 1320a-1320d.

Therefore, the present disclosure relates to an integrated circuit (IC) that comprises a high-k metal gate (HKMG) non-volatile memory (NVM) device and that provides small scale and high performance, and a method of formation.

In some embodiments, the present disclosure relates to an integrated circuit. The integrated circuit comprises a logic region and an embedded memory region disposed adjacent to the logic region. The logic region comprises a logic device disposed over a substrate and including a first metal gate disposed over a first high-k gate dielectric layer. The embedded memory region comprises a non-volatile memory (NVM) device including a split gate flash memory cell disposed over the substrate. The split gate flash memory cell comprises a select gate and a control gate separated by a charge trapping layer extending under the control gate. The control gate or the select gate is a metal gate separated from the substrate by a second high-k gate dielectric layer.

In other embodiments, the present disclosure relates to a method of forming an integrated circuit. The method comprises providing a substrate comprising a logic region and a memory region and forming a first sacrificial gate stack within the logic region and a second sacrificial gate stack within the memory region. The method further comprises forming a third sacrificial gate stack separated from the second sacrificial gate stack by a charge trapping layer. The method further comprises replacing the first sacrificial gate stack and at least one of the second sacrificial gate stack and the third sacrificial gate stack with a high-k gate dielectric layer and a metal layer to form a first metal gate within the logic region and a second metal gate within the memory region.

In yet other embodiments, the present disclosure relates to a method of forming an integrated circuit. The method comprises providing a substrate comprising a logic region having a logic device and a memory region having a NVM device and forming a first sacrificial gate stack within the logic region and a second sacrificial gate stack within the memory region. The method further comprises forming a third gate stack separated from the second sacrificial gate stack by a charge trapping layer. The method further comprises replacing the first and second sacrificial gate stacks with a high-k gate dielectric layer and a metal layer to form a first metal gate within the logic region and a second metal gate within the memory region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC) comprising:

providing a substrate comprising a logic region and a memory region;

forming a first sacrificial gate stack within the logic region and a second sacrificial gate stack within the memory region;
forming a charge trapping layer over the substrate, extended along sidewalls of the first and second sacrificial gate stacks and over the first and second sacrificial gate stacks;
forming a conductive layer over the charge trapping layer having a planar upper surface;
forming a sacrificial hard mask layer on the conductive layer; and
etching the sacrificial hard mask layer by a self-aligned process to remove lateral portions of the sacrificial hard mask layer while leaving vertical portions along sidewalls of the first and second sacrificial gate stacks to form a hard mask on the conductive layer;
etching the conductive layer and the charge trapping layer according to the hard mask to form a third sacrificial gate stack alongside the second sacrificial gate stack; and
replacing the first sacrificial gate stack and at least one of the second sacrificial gate stack and the third sacrificial gate stack with a high-k gate dielectric layer and a metal layer to form a first metal gate within the logic region and a second metal gate within the memory region.

2. The method of claim 1, wherein the memory region comprises:
a flash memory cell disposed over the substrate and comprising a select gate and a control gate separated by a charge trapping layer extending under the control gate;
wherein the second metal gate comprises the select gate.

3. The method of claim 1, wherein the third sacrificial gate stack is replaced with the high-k gate dielectric layer and the metal layer.

4. The method of claim 1, further comprising:
forming sidewall spacers alongside the first, second and third sacrificial gate stacks;
forming source/drain regions within the substrate; and
performing a salicidation process to form a silicide layer on upper surfaces of the source/drain regions.

5. The method of claim 4, further comprising:
forming a contact etch stop layer lining the sidewall spacers;
forming a first inter-layer dielectric layer on the contact etch stop layer; and
performing a first planarization on the first inter-layer dielectric layer and the sidewall spacers to expose the first sacrificial gate stack within the logic region and the second sacrificial gate stack within the memory region.

6. The method of claim 5, replacing the sacrificial gate stacks further comprising:
performing an etch to remove the first sacrificial gate stack and at least one of the second sacrificial gate stack and the third sacrificial gate stack, leaving trenches between the sidewall spacers;
filling the trenches with the high-k gate dielectric layer and the metal layer to form the first metal gate within the logic region and the second metal gate within the memory region; and
performing a second planarization on the metal layer and the high-k gate dielectric layer to form the first metal gate within the logic region and the second metal gate within the memory region.

7. The method of claim 1, wherein forming the first and second sacrificial gate stacks comprises:

forming a gate oxide layer over the substrate;
forming a conductive sacrificial gate layer over the gate oxide layer; and
patterning and etching the conductive sacrificial gate layer to form the first sacrificial gate stack within the logic region and the second sacrificial gate stack within the memory region.

8. The method of claim 1, wherein forming the conductive layer comprises depositing the conductive layer and performing an etch to the conductive layer to form a top surface substantially aligned with top surfaces of a conductive sacrificial gate layer the first and second sacrificial gate stacks.

9. The method of claim 1, wherein the hard mask of the third sacrificial gate stack and the charge trapping layer have top surfaces substantially aligned.

10. A method of forming an integrated circuit (IC) comprising:
providing a substrate comprising a logic region having a logic device area and a memory region having a NVM device area;
forming a first conductive layer over the substrate; and
patterning and etching the first conductive layer to form a first sacrificial gate stack within the logic region and a second sacrificial gate stack within the memory region;
forming a charge trapping layer over the substrate, contacting sidewalls of the first conductive layer and over the first and second sacrificial gate stacks;
forming a second conductive layer over the charge trapping layer;
patterning the second conductive layer and the charge trapping layer to form a third sacrificial gate stack alongside the second sacrificial gate stack; and
replacing the first and second sacrificial gate stacks with a high-k gate dielectric layer and a metal layer to form a first metal gate of a logic device within the logic region and a second metal gate of a NVM device within the memory region.

11. The method of claim 10, wherein the NVM device comprises:
a flash memory cell disposed over the substrate and comprising a select gate and a control gate separated by the charge trapping layer extending under the control gate;
wherein the second metal gate comprises the select gate.

12. The method of claim 11, wherein the third sacrificial gate stack is replaced with the high-k gate dielectric layer and the metal layer.

13. The method of claim 10, replacing the sacrificial gate stacks further comprising:
after forming and patterning the charge trapping layer, forming sidewall spacers alongside and contacting sidewalls of the first conductive layer opposite to the patterned charge trapping layer;
performing an etch to remove the first and second sacrificial gate stacks, leaving trenches between the sidewall spacers; and
filling the trenches with the high-k gate dielectric layer and the metal layer to form the first metal gate within the logic region and the second metal gate within the memory region.

14. The method of claim 13, wherein forming the first and second sacrificial gate stacks comprises:
forming a gate oxide layer over the substrate;
forming a polysilicon layer over the gate oxide layer;

forming a sacrificial hard mask layer over the polysilicon layer; and patterning and etching the sacrificial hard mask layer, the polysilicon layer and the oxide layer to form the first sacrificial gate stack within the logic region and the second sacrificial gate stack within the memory region.

15. The method of claim 14, further comprising:

forming a contact etch stop layer lining the sidewall spacers;

forming a first inter-layer dielectric layer on the contact etch stop layer; and performing a planarization on the first inter-layer dielectric layer and the sacrificial hard mask layer to form the first metal gate within the logic region and the second metal gate within the memory region.

16. A method of forming an integrated circuit (IC), comprising:

providing a substrate comprising a logic region and a memory region;

forming a first conductive layer over the substrate;

patterning and etching the first conductive layer to form a first sacrificial gate stack within the logic region and a second sacrificial gate stack within the memory region;

forming a charge trapping layer over the substrate, contacting sidewalls of the first conductive layer and over the first and second sacrificial gate stacks;

forming a second conductive layer over the charge trapping layer;

forming a hard mask on the second conductive layer;

patterning the second conductive layer according to the hard mask to form a third sacrificial gate stack alongside the second sacrificial gate stack;

replacing the first sacrificial gate stack with a first high-k gate dielectric layer and a first metal gate, and the second sacrificial gate stack with a second high-k gate dielectric layer and a second metal gate;

wherein the first and second high-k gate dielectric layers respectively lines sidewall and bottom surfaces of the first metal gate and the second metal gate.

17. The method of claim 16, wherein the third sacrificial gate stack is not replaced by metal when replacing the first and second sacrificial gate stacks.

18. The method of claim 16, wherein the third sacrificial gate stack is formed to be in direct contact with the charge trapping layer.

19. The method of claim 16, wherein the first metal gate and the second metal gate respectively has a cuboid shape and have upper surfaces aligned with one another; and wherein the third sacrificial gate stack comprises polysilicon, and is separated from the substrate by a gate oxide layer.

20. The method of claim 16, prior to replacing the sacrificial gate stacks, further comprising:

forming a sidewall spacer contacting an upper surface of the substrate and having a first portion contacting a sidewall of the second sacrificial gate stack and a second portion contacting a sidewall of the third sacrificial gate stack;

forming a contact etch stop layer between the logic region and the memory region and having a U shaped structure, wherein the U shaped structure has a first vertical component abutting the first portion of the sidewall spacer and a second vertical component abutting the second portion of the sidewall spacer; and forming an inter-layer dielectric layer directly on the contact etch stop layer.

* * * * *